(12) United States Patent
Bobier

(10) Patent No.: US 6,839,571 B2
(45) Date of Patent: *Jan. 4, 2005

(54) RF SHIELDING DESIGN FOR WIRELESS HIGH-SPEED INTERNET ACCESS SYSTEM

(75) Inventor: Joseph Bobier, Cudjoe Key, FL (US)

(73) Assignee: XG Technology, LLC, Sarasota, FL (US)

( * ) Notice: Subject to any disclaimer, the term of this patent is extended or adjusted under 35 U.S.C. 154(b) by 748 days.

This patent is subject to a terminal disclaimer.

(21) Appl. No.: 09/851,068

(22) Filed: May 8, 2001

(65) Prior Publication Data

US 2001/0044290 A1 Nov. 22, 2001

Related U.S. Application Data

(60) Provisional application No. 60/205,436, filed on May 19, 2000.

(51) Int. Cl.[7] ................................................. H04B 1/38
(52) U.S. Cl. .................... 455/561; 455/562.1; 455/129; 455/103; 455/301
(58) Field of Search ................................. 455/560, 561, 455/562.1, 103, 91, 129, 128, 117, 301; 343/840, 846, 702; 340/310.06

(56) References Cited

U.S. PATENT DOCUMENTS

| | | | | |
|---|---|---|---|---|
| 4,668,934 A | * | 5/1987 | Shuey | 340/310.06 |
| 4,781,603 A | | 11/1988 | Olsson et al. | |
| 5,343,214 A | * | 8/1994 | Hadzoglou | 343/846 |
| 5,635,943 A | * | 6/1997 | Grunwell | 343/702 |
| 6,240,317 B1 | * | 5/2001 | Villaseca et al. | 607/60 |
| 6,275,196 B1 | * | 8/2001 | Bobier | 343/840 |
| 6,405,058 B2 | * | 6/2002 | Bobier | 455/562.1 |
| 6,476,766 B1 | * | 11/2002 | Cohen | 343/846 |
| 2003/0160723 A1 | * | 8/2003 | Cohen | 343/702 |

FOREIGN PATENT DOCUMENTS

EP  0 844 813 A2  5/1998

* cited by examiner

Primary Examiner—Edward F. Urban
Assistant Examiner—Lana Le
(74) Attorney, Agent, or Firm—Dennis L. Cook, Esq.

(57) ABSTRACT

An improvement in the shielding design and deployment of collocated radio transceivers for high-speed wireless Internet access accomplished by increased isolation brought about by wrapping each transceiver in a shield of mild steel, enclosing collocated transceivers and associated equipment in non-reflective enclosures, and use of low loss RF coaxial cables.

3 Claims, 4 Drawing Sheets

RF SHIELDING DESIGN FOR WIRELESS HIGH-SPEED INTERNET ACCESS SYSTEM

CROSS-REFERENCE TO RELATED APPLICATION

The present application claims the benefit of previously filed Provisional Application, Ser. No. 60/205,436 May 19, 2000.

FIELD OF THE INVENTION

This invention relates, generally, to an improvement in radio system construction and deployment that allows for a higher concentration of radio transceivers to be collocated, and more specifically, to a shielding design to allow for a high concentration of transceivers at one location thus improving data rates and significantly lowering the cost of deployment of a wireless Internet access system.

BACKGROUND OF THE INVENTION

As the communications industry continues to evolve, ever-increasing demand for high-speed broadband solutions for communications will result, with the accompanying technologies experiencing a similar demand pattern. While industry analysts predict that 100-megabit speeds will be common by the year 2002, the disclosed system design can assist in delivering these speeds now.

The need for high-speed Internet access within the United States is well defined. With respect to Internet applications alone, as of December 1999, there were fewer than 250,000 U.S. customers purchasing DSL services, as compared to more than 30 million Internet customers. The ever-increasing need for wireless communication services such as Cellular Mobile Telephone (CMT), Digital Cellular Network (DCN), Personal Communication Services (PCS) and the like, typically requires the operators of such systems to serve an ever-increasing number of users in a given service area. As a result, certain types of base station equipment including high capacity Broadband Transceiver Systems (BTS) have been developed, which are intended to service a relatively large number of active mobile stations in each cell. Such BTS equipment can typically service, for example, ninety-six simultaneously active mobile stations in a single four feet tall rack of electronic equipment. This base station equipment typically costs less than $2000 to $4000 per channel to deploy, and so the cost per channel serviced is relationally low. However, demand is increasing beyond capacity and downward cost pressures continue to exist.

Numerous patents have attempted to solve these problem such as U.S. Pat. No. 5,970,410 issued to Carney, et al. on Oct. 19, 1999, titled "Cellular System Plan Using In Band-Translators To Enable Efficient Deployment Of High Capacity Base Transceiver Systems" describes a wireless system architecture whereby high efficiency broadband transceiver systems can be deployed at an initial build out stage of the system in a cost-efficient manner. A home base station location is identified within each cluster of cells, and rather than deploy a complete suite of base station equipment at each of the cells in the cluster, inexpensive translator units are located in the outlying cells serviced by the home base station in which low traffic density is expected. The translators are connected to directional antennas arranged to point back to the home base station site. The translators are deployed in such a way that they mesh with the eventually intended frequency reuse for the entire cluster of cells. The translator to base station radio links operate in-band, that is, within the frequencies assigned to the service provider; for example, the available frequency bands are divided into at least two sub-bands, with a first sub-band assigned for use as a home base station to translator base station communication link, and a second sub band is assigned for use by the mobile station to translator communication link. If desired, a third sub-band can then be used for deployment of base transceiver systems in the conventional fashion where the base station equipment located at the center of a cell site communicates only with mobile stations located within that cell. When coupled with efficient frequency reuse schemes, maximum efficiency in densely populated urban environments is obtained. According to some arrangements, the cells are each split into radial sectors and frequencies are assigned to the sectors in such a manner as to provide the ability to reuse available frequencies. Although frequency reuse schemes can be highly efficient, it requires at least two complete sets of multi-channel transceiver equipment such as in the form of a Broadband Transceiver System (BTS) to be located in each cell.

Nevertheless, when a wireless system first comes on line, demand for use in most of the cells is relatively low, and it is typically not possible to justify the cost of deploying complex multi-channel BTS equipment based only upon the initial number of subscribers. Because only a few cells at high expected traffic demand locations (such as at a freeway intersection) will justify the expense to build-out with high capacity BTS equipment, the service provider is faced with a dilemma. The provider can build-out the system with less expensive narrowband equipment, initially, to provide some level of coverage, and then upgrade to the more efficient equipment as the number of subscribers rapidly increases in the service area; however, the initial investment in narrowband equipment is then lost. Alternatively, a larger up-front investment can be made to initially deploy high capacity equipment, so that once demand increases, the users of the system can be accommodated without receiving busy signals and the like, although this has the disadvantage of carrying the money cost of a larger up front investment.

Other various techniques for extending the service area of a given cell have been proposed. For example, U.S. Pat. No. 4,727,490 issued to Kawano, et al. and assigned to Mitsubishi Denki Kabushiki Kaisha, discloses a mobile telephone system in which a number of repeater stations are installed at the boundary points of hexagonally shaped cells. The repeaters define a small or minor array that is, in effect, superimposed on a major array of conventional base stations installed at the center of the cells. With this arrangement, any signals received in so-called minor service areas by the repeaters are relayed to the nearest base station.

Another technique is disclosed in U.S. Pat. No. 5,152,002 issued to Leslie, et al., wherein the coverage of a cell is extended by including a number of so-called "boosters" arranged in a serial chain. As a mobile station moves along an elongated area of coverage, it is automatically picked up by an approaching booster and dropped by a receding booster. These boosters, or translators, use highly directive antennas to communicate with one another and thus ultimately via the serial chain with the controlling central site. The boosters may either be used in the mode where the boosted signal is transmitted at the same frequency as it is received or in a mode where the incoming signal is retransmitted at a different translated frequency.

Additional attempts to improve coverage include spectral efficiency schemes such as disclosed in U.S. Pat. No. 5,592,490 issued to Barratt, et al., on Jan. 7, 1997 titled "Spectrally Efficient High Capacity Wireless Communication Systems"

which discloses a wireless system comprising a network of base stations for receiving uplink signals transmitted from a plurality of remote terminals and for transmitting downlink signals to the plurality of remote terminals using a plurality of conventional channels including a plurality of antenna elements at each base station for receiving uplink signals, a plurality of antenna elements at each base station for transmitting downlink signals, a signal processor at each base station connected to the receiving antenna elements and to the transmitting antenna elements for determining spatial signatures and multiplexing and demultiplexing functions for each remote terminal antenna for each conventional channel, and a multiple base station network controller for optimizing network performance, whereby communication between the base stations and a plurality of remote terminals in each of the conventional channels can occur simultaneously.

Other methods include specialized propagation techniques such as shown in U.S. Pat. No. 6,058,105 issued to Hochwald, et al. on May 2, 2000 titled "Multiple Antenna Communication System and Method Thereof" which discloses a communications system that achieves high bit rates over an actual communications channel between M transmitter antennas of a first unit and N receiver antennas of a second unit, where M or N>1, by creating virtual sub-channels from the actual communications channel. The multiple antenna system creates the virtual sub-channels from the actual communications channel by using propagation information characterizing the actual communications channel at the first and second units. For transmissions from the first unit to the second unit, the first unit sends a virtual transmitted signal over at least a subset of the virtual sub-channels using at least a portion of the propagation information. The second unit retrieves a corresponding virtual received signal from the same set of virtual sub-channels using at least another portion of said propagation information.

Unfortunately, each of these techniques has their difficulties and add additional costs and complexities to the system. With the method that uses an array of repeaters colocated with the primary cell sites, the implementation of diversity receivers becomes a problem. Specifically, certain types of cellular communication systems, particularly those that use digital forms of modulation, are susceptible to multi-path fading and other distortion. It is imperative in such systems to deploy diversity antennas at each cell site. This repeater array scheme makes implementation of diversity antennas extremely difficult, since each repeater simply forwards its received signal to the base station, and diversity information as represented by the phase of the signal received at the repeater, is thus lost.

The booster scheme works fine in a situation where the boosters are intended to be laid in a straight line along a highway, a tunnel, a narrow depression in the terrain such as a ravine or adjacent a riverbed. However, there is no teaching of how to efficiently deploy the boosters in a two-dimensional grid, or to share the available translated frequencies as must be done if the advantages of cell site extension are to be obtained throughout an entire service region, such as a large city.

Shielding systems for particular circuits are also well known in the prior art. For example, U.S. Pat. No. 5,475,876 issued to Terada, et al. on Dec. 12, 1995, titled "Tuner Unit Having Electromagnetically Isolated UHF And VHF Section With No Noise" discloses a tuner unit including an antenna input filter section, a UHF section, a VHF section, and a PLL section which are electromagnetically separated by walls, an inductor for a VHF local oscillator is disposed adjacent to the UHF section, and is electromagnetically separated by a subdivision wall from the UHF section and the VHF section. Also, U.S. Pat. No. 5,671,220 issued to Tonomura on Sep. 23, 1997, titled "Satellite Channel Interface In Indoor Unit Used For Satellite Data Communication" discloses a Satellite Channel Interface (SCI) that is constituted by an analog section having a multiplexer unit and a down converter unit, and a digital section constituted by a modulator-demodulator unit. The Satellite Channel Interface has a single printed circuit board on which all of the above units are formed. A rectangular member surrounds the analog section, and a shield cover shields an opening portion of the rectangular member. The single printed circuit board is a multi-layered board constituted by at least three conductive layers, of which the bottom two layers are grounding electrodes. The SCI does not require the terminals and cables which are otherwise necessary, can be made compact, and can be manufactured with the reduced number of processing steps.

Additionally, shielding for devices has been used such as in U.S. Pat. No. 5,564,096 issued to Hama, et al. on Oct. 8, 1996, which discloses a portable radio communication device such as wristwatch receiver and/or transmitter that is provided with an effective noise shielding structure. The portable radio communication device includes a high frequency analog circuitry for receiving and transmitting radio signals and further includes digital circuitry for data processing and display. The noise shielding structure protects high frequency noise from being transmitted to the analog circuitry from the digital circuitry and from other outside sources. The noise shielding structure is made of electrically conductive material. In another aspect of the invention, at least one circuit board constructed of a multi-layered construction having at least one inner printed wire pattern is provided. The inner printed wire pattern is set at ground potential with respect to the high frequency output from the analog circuitry. In this manner the inner printed wire pattern serves as a noise shielding member. In addition, the invention obtains effective noise shielding without increasing the size or the manufacturing cost of the device.

A similar device shielding use is shown in U.S. Pat. No. 5,124,889 issued to Humbert, et al. on Jun. 23, 1992, "titled Electromagnetic Shielding Apparatus For Cellular Telephones" that discloses an electromagnetic shielding apparatus for portable telephones and other electronic equipment, includes shield clips for intercoupling the conductive surfaces of a housing to the metal layer of the circuit board. Each shield clip mates with a corresponding edge of the circuit board such that tabs insert into holes in the central channel of the clip and feet of the clip rest on other tabs. The clip is bonded to the metal layer of the circuit board preferably by resistance welding, thereby reliably connecting the clip and the conductive housing surfaces to signal ground.

Finally, U.S. Pat. No. 5,777,856 issued to Phillips, et al. on Jul. 7, 1998, titled "Integrated Shielding And Mechanical Support" discloses an integrated shielding and mechanical support that simultaneously addresses the problems of providing RF shielding for an electronic device such as a radio transceiver and providing a rigid mechanical assembly for the electronic device. Two conductive rails hold together multiple Printed Circuit Boards (PCBs) having conductive layers to produce a four-sided shielding box that protects certain electronic circuits on the PCBs from electromagnetic interference. An internal conductive shield subdivides the inside of the shielding box to provide additional protection for sensitive circuitry. The shielding box inserts into an opening in a five-sided housing section using, which simplifies assembly of PCBs in the housing and facilitates automated assembly. A second housing section attaches to the shielding box once it is inserted into the five-sided housing section.

None of the above patents disclose an effective shielding system allowing for collocation of multiple radio transceivers. Therefore, a need exists for a shielding system for a wireless communications system which achieves high bit rates in a cost effective and relatively simple manner.

It is therefore clear that a primary object of this invention is to advance the art of high-speed wireless Internet access system design. A more specific object is to advance said art by providing an improved shielding design for radio deployment systems usefull for high-speed wireless Internet access.

These and other important objects, features, and advantages of the invention will become apparent as this description proceeds. The invention accordingly comprises the features of construction, combination of elements, and arrangement of parts that will be exemplified in the construction hereinafter set forth, and the scope of the invention will be indicated in the claims.

SUMMARY OF THE INVENTION

Disclosed is an improvement in the shielding design and deployment of collocated radio transceivers for high-speed wireless Internet access accomplished by increased isolation brought about by wrapping each transceiver in a shield of mild steel, enclosing collocated transceivers and associated equipment in non-reflective enclosures, and use of low loss RF coaxial cables.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

The present invention will now be described more fully, hereinafter, with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A type of radio technology known as Spread Spectrum Frequency Hopping, (SSFH) has recently become popular in the industry to deliver wireless Internet access. Frequencies set aside by the FCC and ETSI, known as ISM (Industrial Scientific and Medical) in the 2.4 GHz and 900 MHz bands, have become the de facto standard for such services. These services operate under FCC part 15, unlicensed use, and as such must exist with certain technological hobbles imposed by the governing bodies. Among these limitations are power limitations and uncoordinated frequency hopping.

The radio equipment used for SSFH is designed to share a radio band, typically in the 2.4 GHz to 2.483 GHz frequency band. Since operation is unlicensed, usual governmental frequency usage coordination is impossible. To facilitate free and fair sharing of the available frequencies, Government rules require that the radio transmitters must change frequency of operation on a regular basis, typically within 40 to 400 milliseconds per hop. In addition, the radio frequency hopping pattern must be in a pseudo random pattern. This random hopping pattern then precludes the domination of a given radio frequency by any single radio transmitter. In theory, many users of the frequencies would therefore share the band, with little mutual interference.

Figure 2:
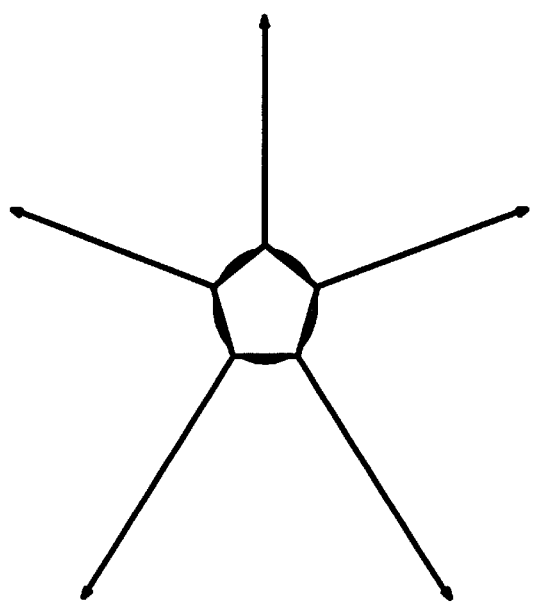
FIG. 2 is the second diagram showing wireless cell layout vectors.

In the case of many users transmitting from different locations, the system works well because the power limits imposed by the governing body and the inability of such high frequencies, especially in the 2.4 GHz band, to penetrate structures and dense foliage will naturally isolate the systems. Thus, the original government analysis and intention is supported. However, if a user wishes to aggregate many transmitters into a single location for the purpose of providing data services to high concentrations of end users by deploying a typical vector cell arrangement as shown in FIG. 2, a self-interference issue quickly mounts.

Figure 3:
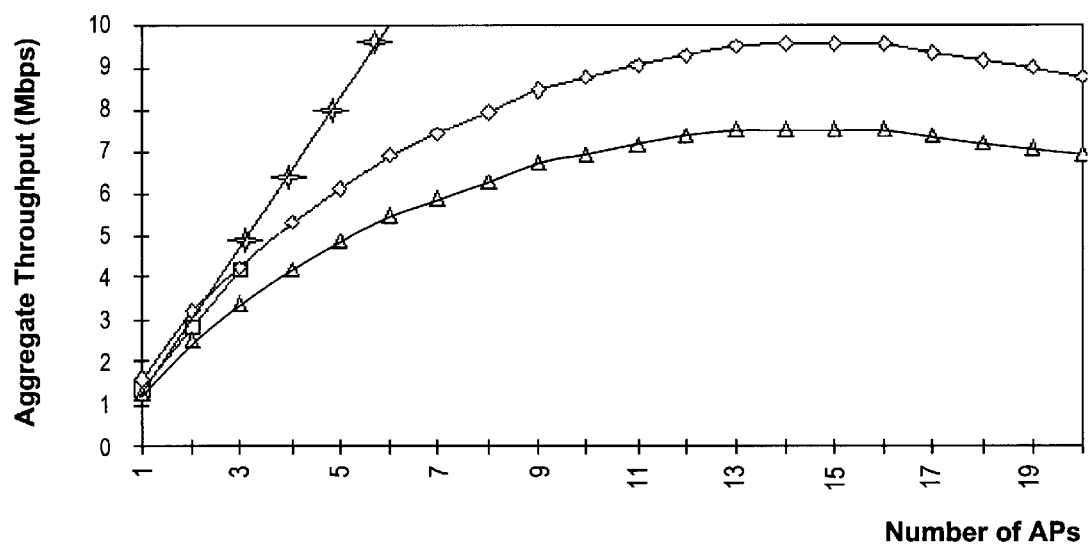
FIG. 3 is a diagram showing aggregate throughput of collocated systems.

Depending upon the type of radio equipment used, one will see severe interference with as few as 4 to 7 radios, and interference is detectable upon addition of just the second radio. At the level of 15 radios, one has reached the absolute point of diminishing returns. Adding more radios will become detrimental and will result in an actual reduction of data throughput. FIG. 3 shows the degradation in throughput speed as the number of collocated radio transceivers is increased for three different transmission systems (triangle line=FHSS industry standard 802.11; diamond line=3 Mbps spread spectrum proprietary system; square line=spread spectrum direct sequence where there are only 3 access points in a system) as compared with the starred straight line which represents a system such as the one disclosed in this invention resulting in complete isolation. This starred line was actually calculated using the 3 Mbps spread spectrum system improved by using the techniques of this invention, but the results would be the same on any of the tested systems using the techniques disclosed herein.

A system has thus been designed as shown by this disclosure which, when used in combination, will mitigate the effect of the radio self-interference, allowing a dramatic increase of data throughput at radio collocations of fewer than 15 devices, and will in effect allow collocation of even substantially more than 15 radios.

Figure 1:
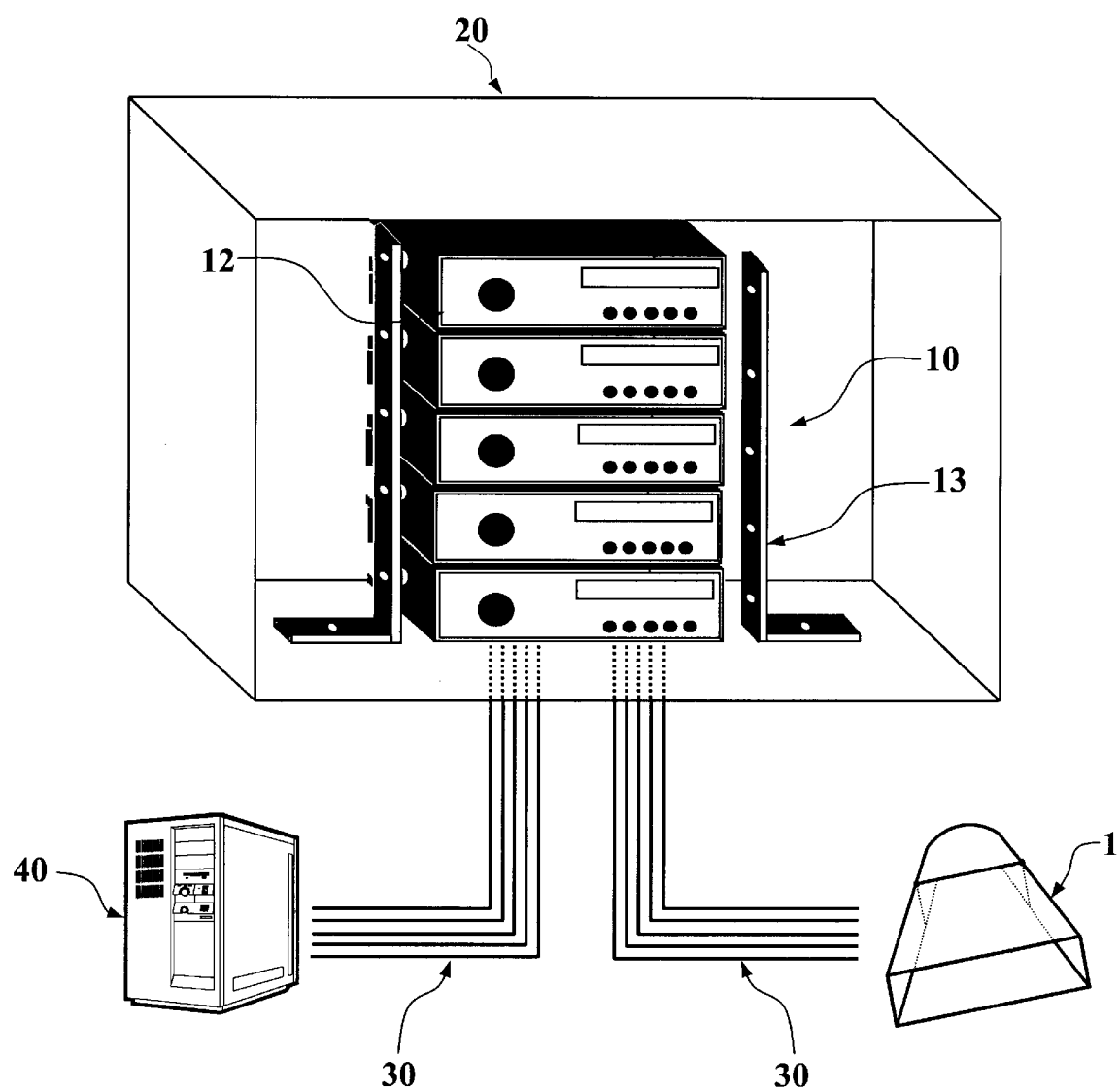
FIG. 1 is the first diagram showing the wireless cell layout of the preferred embodiment.

The overall concept is to isolate the radio transceivers, one from another, so that they cannot detect the signal from all or some of the other transceivers located within the same system. This is accomplished using the improved shielding design of this disclosure along with isolation techniques and mechanical devices, which work together to achieve the overall degree of isolation required. This overall concept is shown in FIG. 1 where the collocated radio transceivers (10) is disclosed. A non-reflective enclosure (20) then encloses the collocated radio transceivers (10) and other equipment (not shown). Low loss coaxial cables (30) are used to feed and transmit signals from a source (40) to the radio transceivers (12), and to connect the radio transceivers (12) to the high parabolic horn antennas (1).

Figure 4:
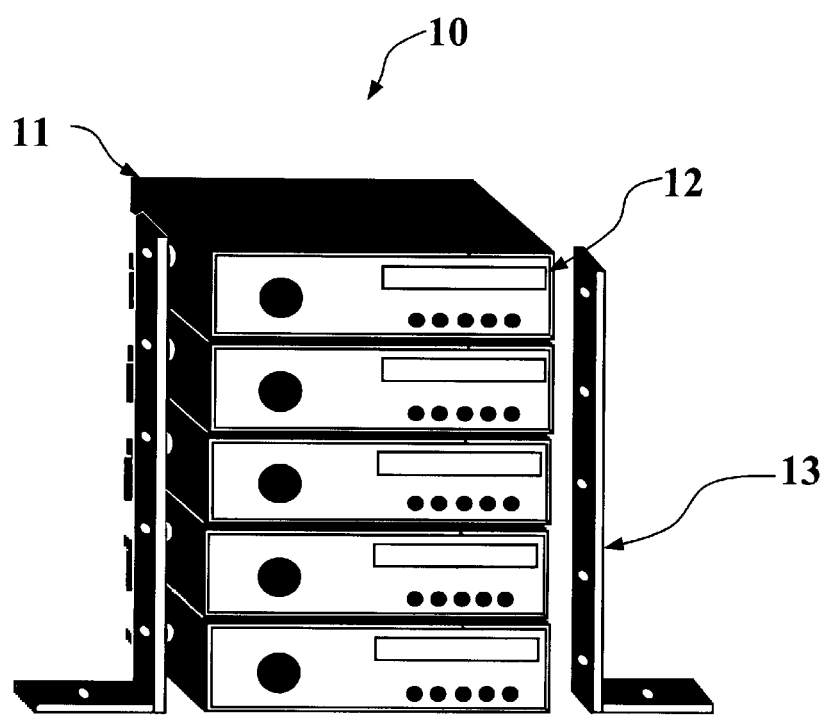
FIG. 4 is a mechanical view of the shielding used on the system.

The first element of the improved shielding system is the shielding of the radio transceivers (12) as shown in FIG. 4. All radio transceivers "leak" radio energy from their enclosures. Other radio transceivers, located in very close proximity and operating on the same or a nearby radio frequency, will become exposed to the leaked RF energy. The exposure will either cause direct interference, or receiver de-sensitization (de-sense). Either effect is destructive and can cause weaker legitimate radio signals to become lost.

This invention combats this effect at the radio transceiver (12) by providing physical isolation shielding around each radio transceiver (12). In practice, this is done by "wrapping" each radio transceiver (12) in a shield of mild steel that is then grounded by the grounding strap (13). As shown in FIG. 4, the system consists of stacking shelves (11), physically wrapped around each radio transceiver (12), which then attach to other shelves (11), in a stacked manner, to create a compact modular collocated radio transceiver (10). In the preferred embodiment the radio transceivers (12) are placed in direct contact, stacked directly one atop another, and thus become separated by two layers of steel shielding, one layer for each stacked shelf (11). This increases the radio density per enclosure without any inter-unit leakage. Typical leakage reduction is on the order of 20 db in the preferred embodiment disclosed in this description.

There are several manufacturers of SSFH radio networking devices or radio transceivers (12) known to those skilled in the art. In the preferred embodiment the SSFH radio transceivers (12) are those manufactured by Breezecom, of California. For any brand, the limitations are essentially the same. Radio transceivers (12) operating on similar radio frequencies will interfere with each other if they can detect competing radio frequency energy. The object of this invention then is to operate radio transceivers (12) on the same or nearby radio frequencies, collocated on the same physical tower or building top, physically near to each other, sometimes within inches, yet provide enough isolation from one radio circuit to another so as to avoid radio interference, one to another.

This invention provides the required high-density, with isolation. The aggregate throughput then is much higher since the radio transceivers (12) essentially do not interfere with each other. This provides a benefit similar to frequency hopping coordination without the actual act of coordination, which is illegal under current U.S. law and laws of most other countries.

Figure 5:
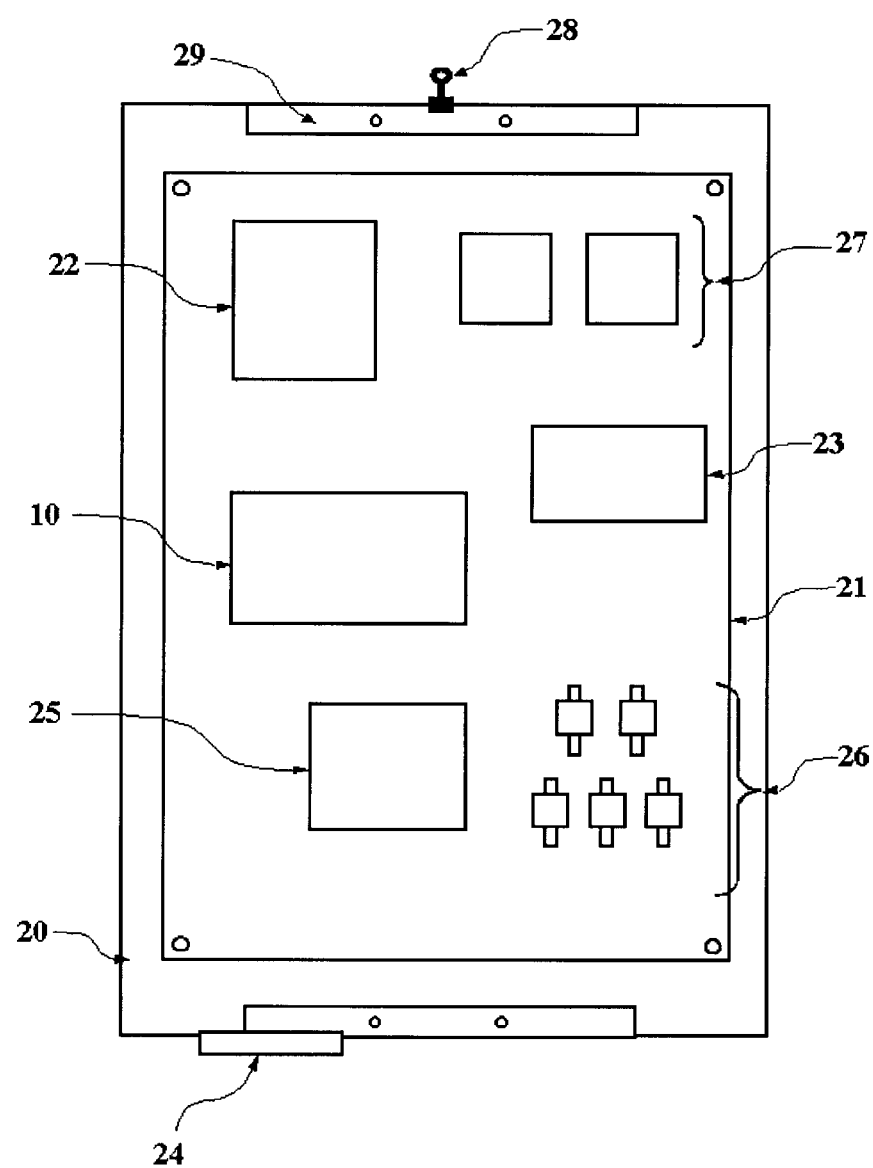
FIG. 5 is a mechanical layout view of a small cell.

The mechanical layout of a typical small cell is shown in FIG. 5 is the preferred embodiment of this invention's "small cell design" which comprises all necessary electrical and electronic equipment to perform the function of a self-contained ISM band data-networking cell. By necessity, the radio transceivers (12) are located near one another within the collocated radio transceivers (10). Since the manufacturer's enclosure design for the radio transceivers (12) is not a perfect RF shield, a small amount of RF energy does "leak" from the radio transceiver (12) itself and cause interference with other nearby radio transceivers (12). This invention provides additional RF shielding around each radio transceiver (12).

The amount of isolation provided by the collocated radio transceivers (10), one radio transceiver (12) to the next adjacent radio transceiver (12) is about 9 db; enough to negate the typical RF leakage observed from these types of devices. Observed RF leakage from one radio transceiver (12) to another radio transceiver (12), when located within 8 inches is about −73 dbm. Radio transceivers (12) stacked one atop another will experience RF interference as high as −68 dbm. Interference is reduced to as low as −81 dbm with the disclosed shielding of the preferred embodiment. This is below the minimum receiver sensitivity. The stacked shelving (11) is so effective that the radio transceivers (12) can literally be stacked directly one atop another without interference as shown in FIG. 4.

Without the stacked shelving (11), it would be impossible to collocate more than about 5 radio transceiver (12) without introducing severe radio interference and the resulting diminishing returns per radio in regard to data throughput. In the preferred embodiment the stacked shelving (11) is fabricated of 40 gauge mild steel. The grounding straps (13) are grounded to the interior equipment base plate (21) of the non-reflective enclosure (20), thus grounding the collocated radio transceivers (10) and improving the shielding effect further. Using the collocated radio transceivers (10), there is virtually no effective limit upon the number of radio transceivers (12) within the same non-reflective enclosure (20) and cell location.

In the prior art the radio equipment is usually mounted inside a weatherproof cabinet or enclosure as a self contained system. The enclosure is then mounted upon a radio tower or other structure, near the antenna location(s). The enclosure will generally house the radios, network devices, power supplies, cooling system, heating system, amplifiers, lightning protection devices and other essential components of the system.

As previously explained, the radio transceivers will leak RF energy. If the radios are housed inside a metallic, radio wave reflective enclosure, as is the case in the prior art, the RF will simply reflect inside the enclosure until it is dissipated. This increases the signal strength of unwanted energy inside the enclosure, increasing the signal noise floor to which the radio transceivers (12) are exposed.

In the preferred embodiment of the present system, a non-reflective enclosure (20) is used, normally a fiberglass enclosure, which is transparent to RF energy. Any leaked RF will simply radiate away without substantial effect.

The placement of items in the small cell configuration of the preferred embodiment is further shown in FIG. 5. The non-reflective enclosure (20) measures 25 inches by 33 inches and houses the interior equipment base plate (21), which measures 22 inches by 29.5 inches. The collocated radio transceivers (10) with radio transceivers (12), network device (22); DC power supply (23), heating system (25), amplifiers (26), and AC outlets (27) are mounted on the interior equipment base plate (21) as shown. The cooling fan (24) with thermostat (not shown) are mounted on the door of the non-reflective enclosure (20).

Also, there are many types and styles of RF coaxial cables that are used in the prior art. It might seem a simple matter, but choosing RF cables which radiate little extraneous signal becomes most important when many like radio transceivers (12) are operating and the associated antenna feed cables are bundled together into a neat installation. Leakage from one cable that is transmitting to another cable that is receiving can account for enough interference to block reception of a weak end-user. Therefore, low leakage RF coaxial cables (30) are essential in achieving the high density system of this invention. LMR 400 and LMR 600 cables are examples of low leakage coaxial cables (30) used in the preferred embodiment of this invention.

In the high-density installation that benefits from this invention parabolic horn antennas (1) should be used, each parabolic horn antenna (1) will be assigned a vector in which to operate. Vectors are then assigned, based upon the parabolic horn antenna (1) horizontal beam width and the number of parabolic horn antennas (1) to be used. A spoke pattern will result with each parabolic horn antenna (1) unable to affect the other. When even more density is required, another tier of parabolic horn antennas (1), comprising a pattern of vectors can be placed upon the same vertical mounting structure as the first array. When high isolation parabolic horn antennas (1) are used, vertical spacing may be as little as three feet. Up to 15 tiers can be used with as many as 12 but typically 6 parabolic horn antennas (1) each.

In the depicted cell of FIG. 2, there are 5 directions or vectors, which the parabolic horn antennas (1) are directed towards. For 360-degree coverage then, each parabolic horn antenna (1) should have a 72-degree beam width. If the parabolic horn antenna (1) used is adjustable, adjustment of the beam width should be exactly 72 degrees. Any number of vectors could be used in a given antenna array, as could any number of arrays, spaced vertically on a given tower. Practical limits dictate about 12 vectors per tier.

If the parabolic horn antenna (1) has sufficient shielding on the sides and back of the parabolic horn antenna (1) to isolate the vectors the number of radio transceivers (12) may be increased beyond the prior art limit of 15 as shown in FIG. 3.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the dependent claims.

What is claimed is:

1. An improvement in the design of shielding used in the deployment of collocated radio transceivers and associated equipment for high-speed wireless Internet access comprising:

shield wraps;

said shield wraps individually enclosing each of at least two radio transceivers;

said shield wraps being stackable one on top another such that said enclosed and stacked radio transceivers become collocated radio transceivers;

a grounding strap;

said grounding strap electrically connecting said shield wraps to an electrical ground;

a non-reflective enclosure;

said non-reflective enclosure enclosing said collocated radio transceivers and associated equipment;

low loss RF coaxial cables; and said low loss RF coaxial cables being used to electrically connect said collocated radio transceivers to a information source such that information can be transferred from said source to said collocated radio transceivers and from said collocated radio transceivers to said source.

2. The improvement in the design of shielding used in the deployment of collocated radio transceivers and equipment for high-speed wireless Internet access of claim 1 further comprising:

said shield wrap being constructed of mild steel.

3. The improvement in the design of shielding used in the deployment of collocated radio transceivers and equipment for high-speed wireless Internet access of claim 1 further comprising:

said non-reflecting enclosure being made of fiberglass.

* * * * *